(12) United States Patent
Yang et al.

(10) Patent No.: US 7,940,500 B2
(45) Date of Patent: May 10, 2011

(54) MULTI-CHIP MODULE PACKAGE INCLUDING EXTERNAL AND INTERNAL ELECTROSTATIC DISCHARGE PROTECTION CIRCUITS, AND/OR METHOD OF MAKING THE SAME

(75) Inventors: Michael Shih Chiang Yang, Hong Kong (CN); Dennis Tak Kit Tong, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 525 days.

(21) Appl. No.: 12/153,754

(22) Filed: May 23, 2008

(65) Prior Publication Data

US 2009/0290271 A1 Nov. 26, 2009

(51) Int. Cl.
*H02H 9/00* (2006.01)
(52) U.S. Cl. .......................................................... 361/56
(58) Field of Classification Search ...................... 361/56
See application file for complete search history.

(56) References Cited

U.S. PATENT DOCUMENTS

| | | | |
|---|---|---|---|
| 5,432,368 A * | 7/1995 | Jimenez | 257/355 |
| 5,652,689 A | 7/1997 | Yuan | |
| 5,670,814 A | 9/1997 | Wu et al. | |
| 6,586,266 B1 * | 7/2003 | Lin | 438/15 |
| 7,067,884 B2 | 6/2006 | Okushima | |
| 7,301,229 B2 | 11/2007 | Yau | |

OTHER PUBLICATIONS

"Electrostatic Discharge (ESD) Technology Roadmap," ESD Association, Mar. 4, 2005, pp. 1-7.
"Trends in Integrated Circuits that Affect ESD Protection Requirements," Semiconductor Components Industries, LLC, Jan. 2008—Rev. 2, pp. 1-3.

* cited by examiner

*Primary Examiner* — Stephen W Jackson
(74) *Attorney, Agent, or Firm* — Nixon & Vanderhye P.C.

(57) ABSTRACT

Certain example embodiments disclosed herein relate to multi-chip module (MCM) packages that include external and internal electrostatic discharge (ESD) protection circuits, and/or methods of making the same. In certain example embodiments, ESD protection circuits are located under the IO pads in the MCM package, the size of the internal dies' ESD circuits are reduced (e.g., by making them as small as possible in certain example implementations), and high-immunity ESD circuits are provided to the IO pads where they are exposed to the external environment. The external ESD protection circuits may provide a higher level of voltage protection than the internal ESD protection circuits. Thus, the external ESD protection circuits may provide shock protection from human body model shocks, whereas the internal ESD protection circuits may provide protection from machine or assembly model shocks.

20 Claims, 4 Drawing Sheets

MULTI-CHIP MODULE PACKAGE INCLUDING EXTERNAL AND INTERNAL ELECTROSTATIC DISCHARGE PROTECTION CIRCUITS, AND/OR METHOD OF MAKING THE SAME

FIELD OF THE INVENTION

The example embodiments disclosed herein relate to multi-chip module (MCM) packages and, more particularly, the example embodiments disclosed herein relate to MCM packages including external and internal electrostatic discharge (ESD) protection circuits, and/or methods of making the same. In certain example embodiments, ESD protection circuits are located under the IO pads in the MCM package, the size of the internal dies' ESD circuits are reduced (e.g., by making them as small as possible in certain example implementations), and high-immunity ESD circuits are provided to the IO pads where they are exposed to the external environment.

BACKGROUND OF THE INVENTION

Complementary metal oxide semiconductors, also sometimes called complementary-symmetry metal oxide semiconductors or CMOS, is a known class of integrated circuits (ICs). CMOS technology is used in, for example, microprocessors, microcontrollers, static RAM, and other digital logic circuits, as well as analog logic circuits. Typical digital CMOS designs implement complementary and symmetrical pairs of p-type and n-type metal oxide semiconductor field effect transistors (MOSFETs) for logic functions. The physical structure of certain field-effect transistors in CMOS typically includes a metal gate electrode placed on top of an oxide insulator which, in turn, is on top of a semiconductor material. Some current gate electrodes are made from a material other than metal such as, for example, polysilicon, but the term CMOS often is still used to refer to these designs.

CMOS devices typically have high noise immunity and low static power consumption. Generally, significant power is drawn only when the transistors in the CMOS device switch between on and off states. Thus, CMOS devices generally do not produce as much heat waste as other forms of logic. CMOS technology also allows for a high density of logic functions on a chip. Indeed, technology scaling in CMOS devices advantageously has led to thinner gate oxides, more shallow junctions, higher doping densities, etc.

Unfortunately, however, the same technology scaling also has had a negative impact on electrostatic discharge (ESD) immunity. Technology scaling in CMOS increases the density because the digital circuit can be scaled. However, the ESD circuit cannot be scaled, and thus a corresponding ESD immunity cannot be achieved when the technology is scaled. ESD generally refers to the movement of static electricity from a nonconductive surface, which can damage semiconductors and other circuit components in integrated circuits.

ESD may be imparted to an integrated circuit within an IC package when the integrated circuit or the IC package is contacted by an electrostatic charge source that may be encountered during assembly, or afterwards, e.g., when the device is in the field. For perspective, it is noted that a person walking on a carpet sometimes can carry an electrostatic charge of up to several thousand volts under high humidity conditions and over 10,000 volts under low humidity conditions.

Thus, it will be appreciated that there is a need in the art for techniques that improve the ESD immunity of CMOS ICs. It also will be appreciated that there is a need in the art for techniques that maintain and/or improve the ESD immunity of an advanced CMOS IC when the technology is scaled.

SUMMARY OF THE INVENTION

One aspect of an example embodiment relates to using low-cost CMOS technology as a substrate for a multi-chip module (MCM) package of an advanced integrated circuit, and locating ESD circuits on the IOs of the low-cost CMOS technology to help protect the advanced technology ICs from static charges including, for example, ESD produced in human and/or machine models.

Another aspect of certain example embodiments relates to locating ESD protection circuits under IO pads in an MCM package, reducing the size of the internal dies' ESD circuits (e.g., by making them as small as possible in certain example implementations), and providing high-immunity ESD circuits to the IO pads where they are exposed to the external environment.

Still another aspect of certain example embodiments relates to an MCM package having a plurality of external ESD protection circuits connected to the pads of the MCM package and at least one internal ESD protection circuit within the MCM package. The plurality of internal and/or external ESD protection circuits are located under the IO pads and may be connected thereto via a flip chip or wire bonding connections. The external ESD protection circuits help reduce human body related ESD, whereas the at least one internal ESD protection circuit helps reduce machine-related ESD. This example arrangement provides a very flexible, low cost design that can be used for various technology areas, including CMOS devices.

In certain example embodiments, a package (e.g., an MCM package) is provided. The package comprises a plurality of external IO pads; a plurality of external electrostatic discharge (ESD) protection circuits located under the external IO pads; a plurality of dies or integrated circuits (ICs); a plurality of internal bond pads provided to the dies or integrated circuits; and a plurality of internal electrostatic discharge (ESD) protection circuits located under the internal bonding pads. The dies or ICs are connected to each other via connections among and/or between the plurality of internal bond pads respectively provided thereto.

In certain example embodiments, a method of making a package (e.g., an MCM package) is provided. A plurality of external IO pads is provided. A plurality of external ESD protection circuits is located under the external IO pads. A plurality of dies or integrated circuits (ICs) is provided. A plurality of internal bond pads is provided to the dies or integrated circuits. A plurality of internal ESD protection circuits is located under the internal bonding pads. The dies or ICs are connected to each other via connections among and/or between the plurality of internal bond pads respectively provided thereto. The plurality of external ESD protection circuits provides a higher level of voltage protection than the plurality of internal ESD protection circuits.

In certain example embodiments, a package (e.g., an MCM package) is provided. The package comprises a plurality of external IO pads; a plurality of external electrostatic discharge (ESD) protection circuits located under the external IO pads; a plurality of dies or integrated circuits; a plurality of internal bond pads provided to the dies or integrated circuits; and a plurality of internal electrostatic discharge (ESD) protection circuits located under the internal bonding pads. The dies or integrated circuits are connected to each other via connections among and/or between the plurality of internal bond pads respectively provided thereto. The plurality of external ESD protection circuits provides a higher level of voltage protection than the plurality of internal ESD protection circuits. The external and/or internal ESD protection circuits comprise one or more diodes.

Other aspects, features, and advantages of the example embodiments will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
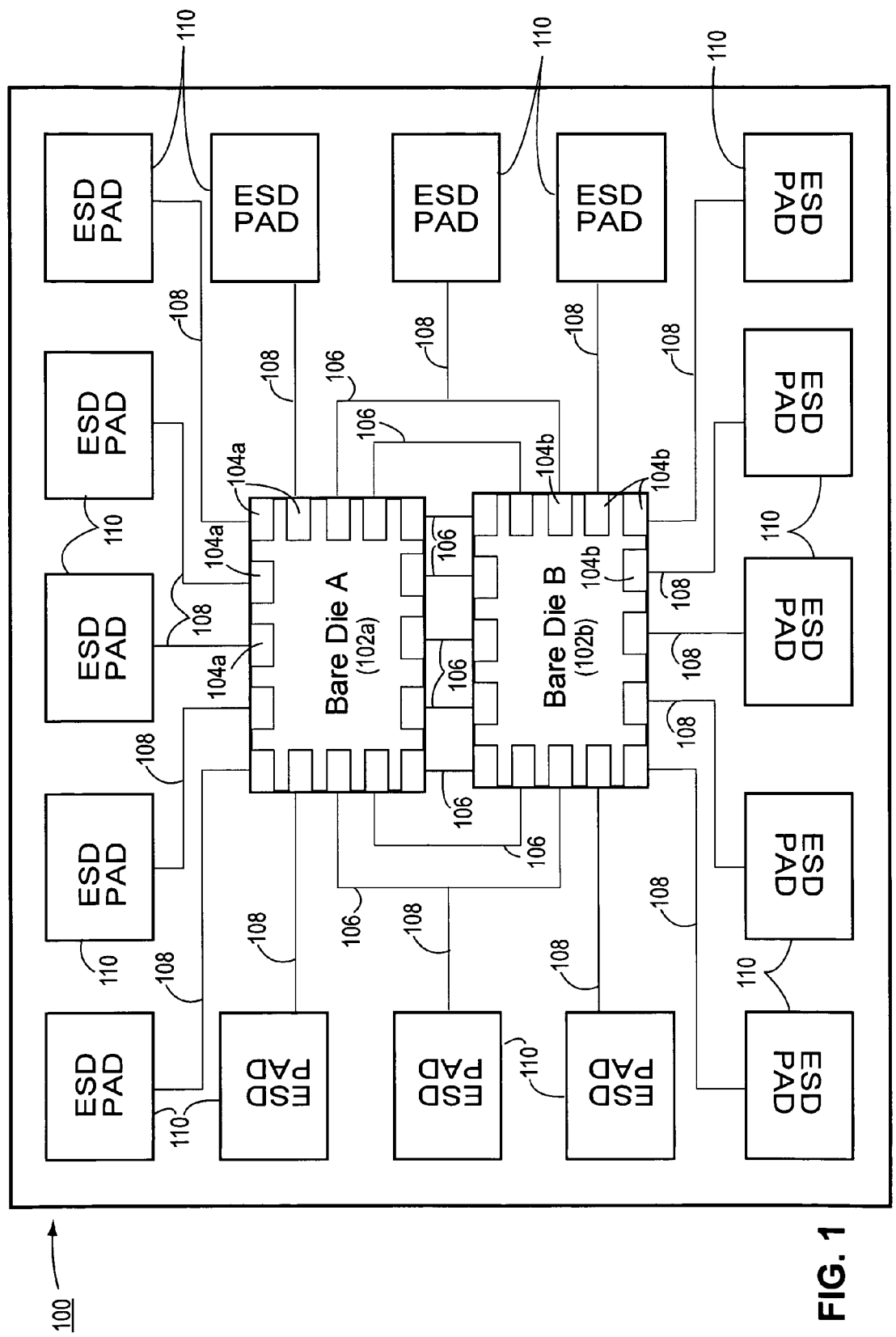
FIG. 1 illustrates interconnections among and between two dies' IO pads, as well as to the package's IO pads, in accordance with an example embodiment.

Certain example embodiments improve the electrostatic discharge (ESD) immunity of CMOS integrated circuits (ICs). Additionally or in the alternative, certain example embodiments maintain and/or improve the ESD immunity of advanced CMOS ICs when such technology is scaled. This may be accomplished in certain example implementations by providing at least one advanced IC die and connecting thereto at least one internal ESD circuit that is built using a less expensive CMOS technology. The connection between the at least one advanced IC die and the at least one internal ESD circuit may be made via wire bonding and/or flip-chip bonding. Additionally, at least one high-immunity ESD circuit may be connected to the multi-chip module (MCM) IO pad. That is, at least one high-immunity ESD circuit may be provided remote from the advanced ICs. The high-immunity ESD circuit may be wire bonded and/or flip-chip bonded to the MCM IO pad.

The static charge buildup from the human body is higher and less controllable than static charges from the assembly or manufacturing facility and/or process. Indeed, the machine model static charge may be tightly controlled in the assembly or manufacturing facility so that ESD immunity during assembly and/or manufacturing is not as large an issue as when the IC is handled by a human. The larger and less controllable electrical static charge typically comes from humans when they touch the ICs. By using the design arrangement of certain example embodiments, however, the internal advanced ICs are better protected by the high-immunity external ESD circuits on the IOs of the package. Thus, the at least one advanced IC die may be protected from the harsh environment by these external ESD circuits, while the internal ESD circuits may provide a lower amount of static charge protection.

In this way, for example, moving a high-immunity ESD circuit away from the at least one die to the IO pad where the IOs are exposed to the external environment helps to relieve the burden of the ESD design on the advanced ICs. Thus, these internal ESD circuits generally only need to be able to tolerate lower level charges (e.g., machine model static charges). As noted above, the machine model static charges are smaller and easier to control themselves, when compared with human model charges.

The required protection voltages for the internal and external ESD circuits may vary. In certain example embodiments, the human body model static charge may be about 5,000 volts or even higher, depending on the environment. As noted above, the machine model static charge can be controlled more easily. In certain example environments, for example, the machine model static charge can be controlled to about 20 volts. The overall effect of technology changes on the ESD robustness of integrated circuits is discussed in "Electrostatic Discharge (ESD) Technology Roadmap," Electrostatic Discharge Association (ESDA), 2005, the entire contents of which is hereby incorporated herein by reference. This document indicates that the minimum and maximum CMOS human body model ESD requirements are currently are about 300 volts and 8,000 volts, respectively, whereas the minimum and maximum CMOS machine model ESD requirements currently are about 25 volts and 600 volts, respectively. Future trend information also is provided. The levels disclosed therein provide one set of benchmarks for the high- and low-immunity ESD protection circuits. Some trends in IC design that affect ESD protection requirements are discussed in "Trends in Integrated Circuits that Affect ESD Protection Requirements," ON Semiconductor, AND8309/D, 2008, the entire contents of which is hereby incorporated herein by reference. This document indicates that the operating voltage for future ICs will be reduced to less than 0.7 volts (maximum), which will have an impact on the ESD protection circuit design. Although particular ranges have been disclosed and identified herein, it will be appreciated that the actual static charges encountered may be higher or lower, for either or both of human body model and machine model charges. Thus, the voltage protection provided by certain example embodiments may be higher or lower than these values for either or both of the human body model and machine model.

As is known, a multi-chip module (MCM) refers to a specialized electronic package that includes multiple integrated circuits (ICs), semiconductor dies, and/or other modules. These elements are packaged so as to facilitate their use as a single IC. The MCM itself is sometimes referred to as a "chip" in designs, which is somewhat indicative of its integrated nature. The MCM package of certain example embodiments may be designed using any mature and/or low cost CMOS or other technology. An IO pad ring for use with such MCM packages may be fabricated by a foundry house, for example. Once a schematic of bare dies has been selected, advanced technology interconnects may be designed, and an overall layout may be designed based on these schematics.

Moving the high-immunity ESD circuit to the package IOs rather than leaving them inside of the advanced ICs in accordance with certain example embodiments provides a number of advantages. For instance, this example arrangement reduces the cost of the advanced ICs, as the ESD circuits located therein can be very small in size. This reduction in size, in turn, effectively increases the area that can be used for other components (e.g., other parts of the IC itself). The overall area of the advanced ICs may be reduced, as well. For instance, in certain example embodiments, the interconnections among the advanced ICs' IOs inside of the MCM package do not necessarily need to be protected by the external ESD circuit.

Certain example embodiments advantageously may enable the same or similar IO pads rings of the package to be reused without redesign when application specific integrated circuits (ASICs) are implemented, designed, and/or redesigned, e.g., as technology advances (e.g., to a smaller dimension in channel size).

Referring now more particularly to the drawings, FIG. 1 illustrates interconnections among and between two dies' IO pads, as well as to the package's IO pads, in accordance with an example embodiment. Although first and second bare dies 102a and 102b are shown in the package 100 of FIG. 1, it will be appreciated that more or fewer dies may be included in certain example embodiments. The first bare die 102a includes a plurality of internal bond pads 104a. Similarly, the second bare die 102b includes a plurality of internal bond pads 104b. The first and second bare dies 102a and 102b may be connected via interconnections 106, e.g., that connect the internal bond pads 104a and 104b of the first and second bare dies 102a and 102b, respectively. The first and second bare dies 102a and 102b may be connected, directly or indirectly, to the external IO pads 110 of the package 100 via connections 108.

In certain example embodiments, the ESD protection circuits connected to the internal dies may be reduced in size (e.g., may be made as small as possible in certain example implementations), implying low immunity in protecting against static charges. However, large ESD protection circuits or areas may be provided where the package is exposed to the external environment, with the increased area implying higher immunity when protecting against static charges. The illustrative implementation of high immunity ESD protection circuits where the package is exposed to the uncontrolled environment (e.g., to human body model static charges, which tend to be the largest and least controllable charges and thus the greatest threat to the ICs) may lead to cost savings in certain example embodiments, e.g., by simplifying the design of the ICs. In certain example embodiments, high immunity ESD protection circuits may be connected to the IO pads of the package only where the IO pads are exposed to the external environment.

The high-immunity and low-immunity ESD protection circuits are respectively located under the external IO pads (e.g., the IO pads of the package) and under the internal IO pads (e.g., the IO pads of the ICs). ESD protection circuits capable of being located under IO pads are disclosed in, for example, U.S. Pat. Nos. 5,652,689 and 5,670,814, the entire contents of each of which are hereby incorporated herein by reference.

Figure 2:
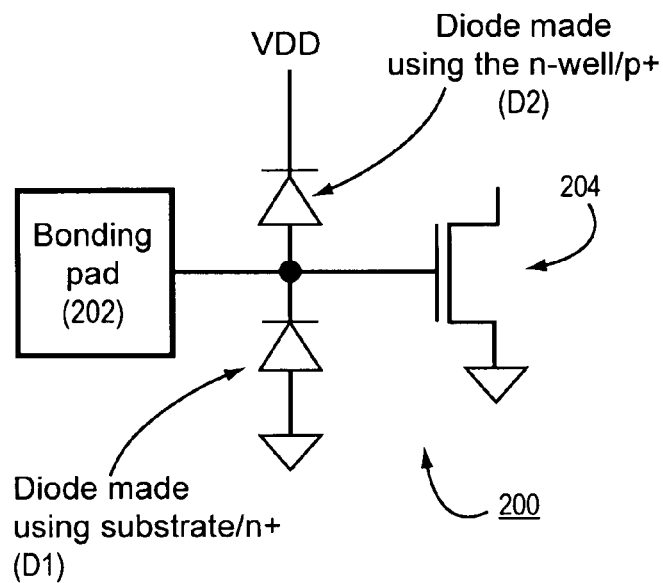
FIG. 2 is an illustrative schematic of a generic ESD circuit in relation to an IO or bonding pad and a transistor in accordance with an example embodiment.

FIG. 2 is an illustrative schematic of a generic ESD circuit 200 in relation to an IO or bonding pad 202 and a transistor 204 in accordance with an example embodiment. First and second diodes D1 and D2 are provided. These two diodes help the circuit to act as an ESD protection circuit. For example, the protection of the driver may be accomplished in certain example embodiments by reducing the voltage of the IO pad 202 to a level below the failure level of the output driver by bypassing or channeling most of the ESD stress or current to VDD or ground. In the example shown in FIG. 2, the first diode D1 is a substrate/n+ diode, whereas the second diode D2 is an n-well/p+ diode. In certain example embodiments, the ESD protection circuit diode(s) may be provided on the substrate, whereas the IO pads may be provided on the top layer of the metal. However, it will be appreciated that other kinds of diodes may be used in connection with the same and/or different types of ESD protection circuits in certain example implementations. Thus, the ESD protection circuits described herein may be made according to any suitable design that, directly or indirectly, helps to protect the internal dies, with the internal dies being produced using any suitable technique (e.g., advanced IC lithography).

Figure 3:
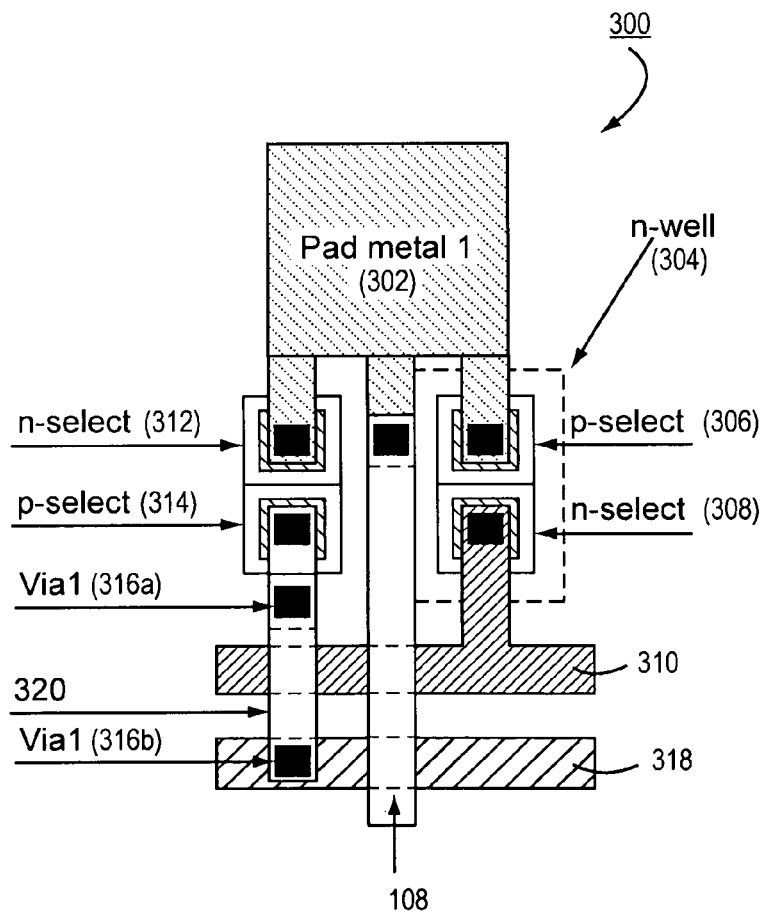
FIG. 3 is an illustrative layout of an ESD circuit (e.g., for the illustrative ESD circuit diagram shown in FIG. 2) connected to the VDD and ground busses, in accordance with an example embodiment.

FIG. 3 is an illustrative layout 300 of an ESD circuit (e.g., for the illustrative ESD circuit diagram 200 shown in FIG. 2) connected to the VDD and ground busses, in accordance with an example embodiment. The left portion of the layout 300 corresponds to the first diode D1 in FIG. 2, and the right portion of the layout 300 corresponds to the second diode D2 in FIG. 2. The pad 202 shown in FIG. 2 includes a metal portion 302. As alluded to above (e.g., in connection with FIG. 1), a connection 108 is made between the metal portion 302 of the pad 202 and the chip's circuitry. This connection 108 may be made using the same or different metal as the metal portion 302 of the pad 202.

With respect to the first diode D1, the metal portion 302 of the pad 202 is connected to the n-select 312 thereof. The p-select 314 is connected to the ground bus 318 via first and second vias 316a and 316b, e.g., using a second metal 320. Thus, it will be appreciated that the first diode D1 shown as part of the circuit in FIG. 2 and in layout form in FIG. 3 is a substrate/n+ type diode.

With respect to the second diode D2, an n-well 304 is provided. A p-select 306 and an n-select 308 are located within the n-well 304. The p-select 306 is connected to the metal portion 302 of the pad 202. The n-select 308 is connected to the VDD bus 310. Thus it will be appreciated that the second diode D2 shown as part of the circuit in FIG. 2 and in layout form in FIG. 3 is a substrate/n+ type diode.

It will be appreciated that the same or different illustrative layouts may be used in connection with the circuit shown in FIG. 2, and/or that other circuits may have different corresponding layouts in certain example embodiments. For example, it will be appreciated that the actual circuit layout for the ESD protection circuits may be a simple diode-inclusive arrangement like those currently commercially available. Thus, it is not always necessary to implement special, custom-made circuit designs. Indeed, some ESD protection circuits are available directly from foundry houses for use with IO pads.

Figure 4:
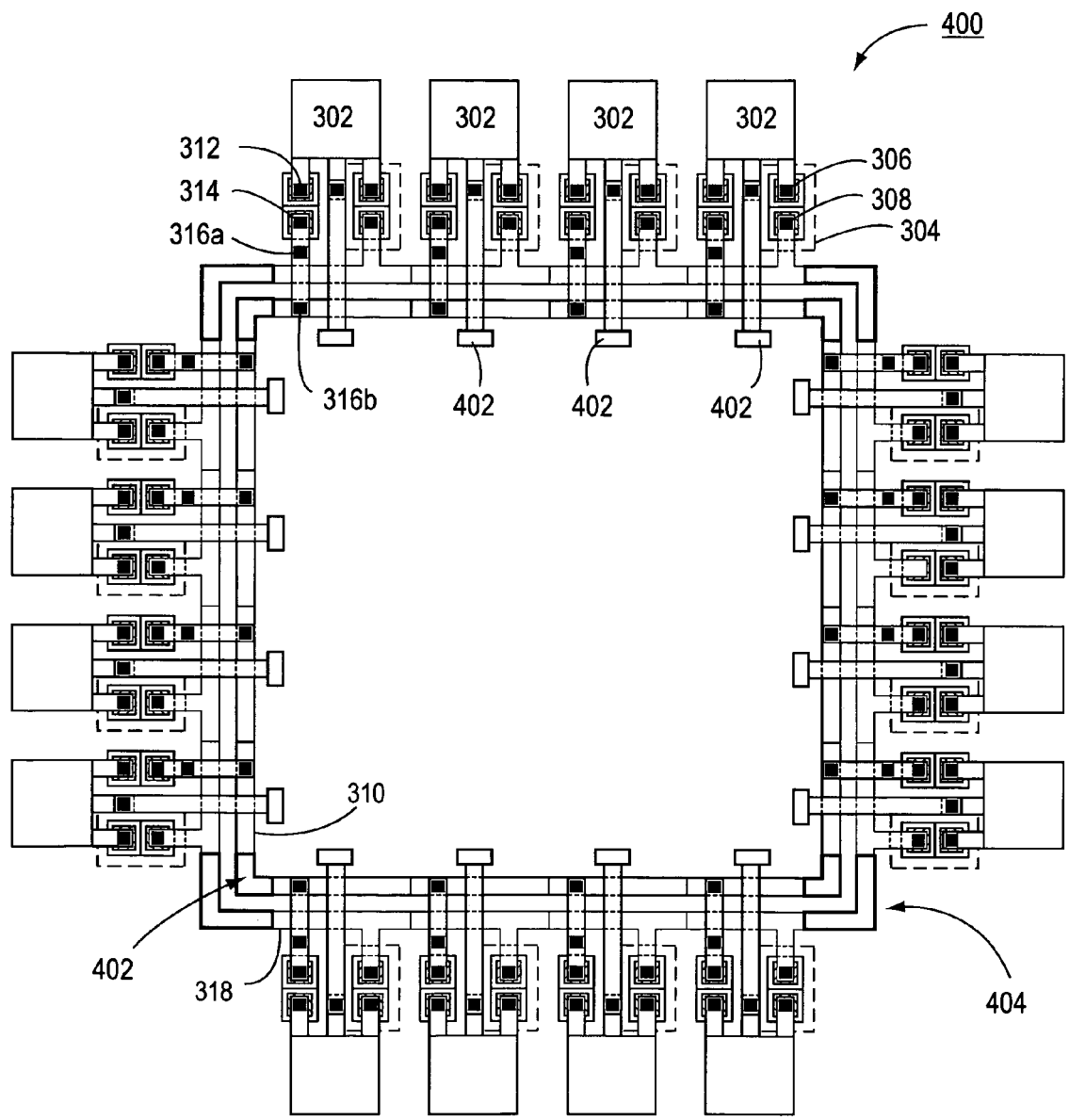
FIG. 4 is an illustrative pad ring layout for a package in accordance with an example embodiment.

FIG. 4 is an illustrative pad ring layout for a package 400 in accordance with an example embodiment. As can be seen in FIG. 4, a plurality of the high-immunity ESD protection circuits shown in FIG. 2 are disposed in a ring-link arrangement around the periphery of the package 400. Although 16 such high-immunity ESD protection circuits are shown in FIG. 2, more or fewer high-immunity ESD protection circuits may be included in the packages of certain example embodiments. Also, although not shown, it will be appreciated that any number of ICs may be included inside the package 400. The internal bonding pads of the ICs (not shown) may be connected to the connections 402 of the of the ESD protection circuits.

As shown in FIG. 4, the VDD bus 310 and the ground bus 318 extend around the package 400, e.g., to facilitate connections with the high-immunity ESD protection circuits. The VDD bus 310 and the ground bus 318 are respectively connected to the VDD pad 404 and the ground pad 402. The VDD pad 404 and the ground pad 402 may be located substantially at the corners of the package 400, as shown in the FIG. 4 example embodiment. Although the package 400 shown in FIG. 4 is substantially square-shaped, however, it will be appreciated that other designs and/or shapes may be implemented in connection with certain other example embodiments.

In view of the above, it will be appreciated that the IO pad ring of the package 400 can become a universal or generic platform, thus enabling it to be used or reused for a variety of die applications. For instance, the packages of certain example embodiments may be offered as 256 pin or 128 pin packages in certain example instances. Conventionally, IO pad ring design involves a large effort in connection with IC design. However, providing a universal or generic platform according to certain example embodiments may help to save time and money for IC design operations.

Furthermore, certain example embodiments provide an elegant solution to a challenging design issue that is both simple in structure and easy to implement and design. Indeed, the simplified design structures and/or processes described in connection with certain example embodiments herein may reduce the need for experts in ESD design that typically are consulted for IC development.

Using existing and mature technology to resolve the ESD issues of the advanced CMOS technology in accordance with certain example embodiments described herein provides a number of advantages. For example, the resiliency, durability, and/or reliability of the advanced ICs may be increased, even when the ICs are not treated with the utmost care. The simple structures and easy to implement designs help to reduce time to market, e.g., by simplifying the design cycle, reducing the amount of engineering resources required for design operations, reducing testing times and costs, and/or simplifying the overall circuit design. Advantageously, overall die cost may be reduced.

Similarly, using the MCM package itself to help address the ESD problems may be accomplished using a mature and low cost technology. Even advanced ICs such as 65 nm, 45 nm, and/or other advanced designs may be protected from ESD damage by moving the high-immunity ESD protection circuits to the MCM package. The need for new high-immunity ESD protection circuit designs for use with and/or in new advanced ICs is reduced (and sometimes even eliminated), since the high-immunity ESD protection circuits are moved to the package itself in certain example embodiments. The movement of the high-immunity ESD protection circuits, in turn, increase the effective area of the advanced ICs (e.g., since they are no longer present and simply replaced with low-immunity ESD circuits). Advantageously, however, the reliability of the advanced ICs as a whole may be increased, and the MCM platform may be used when the ICs scales with advancing technology.

Figure 5:
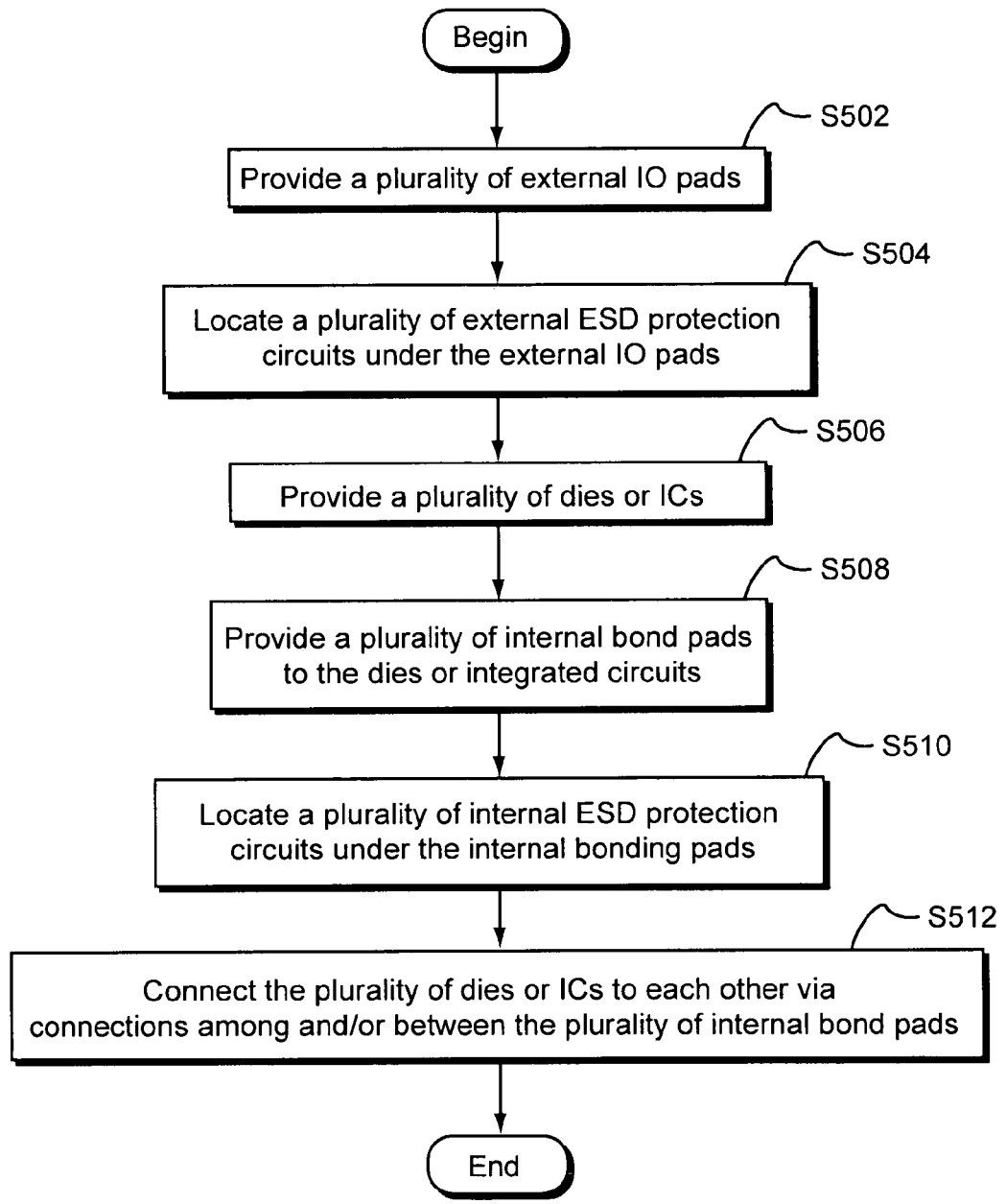
FIG. 5 is a flowchart showing an illustrative process for assembling a package according to an example embodiment.

FIG. 5 is a flowchart showing an illustrative process for assembling a package according to an example embodiment. In step S502, a plurality of external IO pads are provided. In step S504, a plurality of external ESD protection circuits are located under the external IO pads. A plurality of dies or ICs are provided in step S506. A plurality of internal bond pads are provided to the dies or integrated circuits in step S508. In step S510, a plurality of internal ESD protection circuits are located under the internal bonding pads. In step S512, the plurality of dies or ICs are connected to each other via connections among and/or between the plurality of internal bond pads.

In certain example embodiments, the external ESD protection circuits provide shock protection from human body model shocks, and the internal ESD protection circuits provide protection from machine or assembly model shocks. Thus, in certain example implementations, the plurality of external ESD protection circuits provides a higher level of voltage protection than the plurality of internal ESD protection circuits. For example, the external ESD protection circuits may provide shock protection up to at least about 5,000 volts, and/or the internal ESD protection circuits may provide shock protection up to at least about 20 volts.

The external ESD protection circuits may be connected to the external IO pads via respective flip-chip connections or via respective wire bonding connections in certain example embodiments. Similarly, the internal ESD protection circuits may be connected to the ICs via flip-chip connections or via wire bonding connections in certain example embodiments.

In certain example embodiments, the external and/or internal ESD protection circuits may comprise first and second diodes. In certain example implementations, the first diode may be a substrate/n+ type diode, and the second diode may be an n-well/p+ diode. The first and/or second diodes may be located on the substrate, and the internal and/or external IO pads may be located on a top metal-inclusive layer of respective bonding pads in certain example implementations.

The features, aspects, and advantages of the example embodiments described herein may be combined and/or recombined in any suitable combination or sub-combination to achieve yet further embodiments.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A multi-chip module (MCM) package, comprising:
a plurality of external IO pads;
a plurality of external electrostatic discharge (ESD) protection circuits located under the external IO pads;
a plurality of dies or integrated circuits (ICs);
a plurality of internal bond pads provided to the dies or integrated circuits; and
a plurality of internal electrostatic discharge (ESD) protection circuits located under the internal bonding pads,
wherein the dies or ICs are connected to each other via connections among and/or between the plurality of internal bond pads respectively provided thereto.

2. The package of claim 1, wherein the plurality of external ESD protection circuits provides a higher level of voltage protection than the plurality of internal ESD protection circuits.

3. The package of claim 2, wherein the external ESD protection circuits provide shock protection up to at least about 5,000 volts.

4. The package of claim 2, wherein the internal ESD protection circuits provide shock protection up to at least about 20 volts.

5. The package of claim 2, wherein the external ESD protection circuits provide shock protection from human body model shocks, and
wherein the internal ESD protection circuits provide protection from machine or assembly model shocks.

6. The package of claim 1, wherein the external ESD protection circuits are connected to the external IO pads via respective flip-chip connections and/or the internal ESD protection circuits are connected to the internal bonding pads via respective flip-chip connections.

7. The package of claim 1, wherein the external ESD protection circuits are connected to the external IO pads via respective wire bonding connections and/or the internal ESD protection circuits are connected to the internal bonding pads via respective wire bonding connections.

8. The package of claim 1, wherein the external and/or internal ESD protection circuits comprise first and second diodes.

9. The package of claim 8, wherein the first diode is a substrate/n+ type diode, and wherein the second diode is an n-well/p+ diode.

10. The package of claim 9, wherein the first and/or second diodes are located on the substrate, and wherein the internal and/or external IO pads are located on a top metal-inclusive layer of respective bonding pads.

11. A method of making a multi-chip module (MCM) package, the method comprising:

providing a plurality of external IO pads;

locating a plurality of external ESD protection circuits under the external IO pads;

providing a plurality of dies or integrated circuits (ICs);

providing a plurality of internal bond pads to the dies or integrated circuits;

locating a plurality of internal ESD protection circuits under the internal bonding pads; and connecting the plurality of dies or ICs to each other via connections among and/or between the plurality of internal bond pads, wherein the plurality of external ESD protection circuits provides a higher level of voltage protection than the plurality of internal ESD protection circuits.

12. The method of claim 11, wherein the external ESD protection circuits provide shock protection up to at least about 5,000 volts.

13. The method of claim 11, wherein the internal ESD protection circuits provide shock protection up to at least about 20 volts.

14. The method of claim 11, wherein the external ESD protection circuits provide shock protection from human body model shocks, and wherein the internal ESD protection circuits provide protection from machine or assembly model shocks.

15. The method of claim 11, further comprising connecting the external ESD protection circuits to the external IO pads via respective flip-chip connections and/or connecting the internal ESD protection circuits to the internal bonding pads via respective flip-chip connections.

16. The method of claim 11, further comprising connecting the external ESD protection circuits to the external IO pads via respective wire bonding connections and/or connecting the internal ESD protection circuits are connected to the internal bonding pads via respective wire bonding connections.

17. The method of claim 11, wherein the external and/or internal ESD protection circuits comprise first and second diodes.

18. The method of claim 17, wherein the first diode is a substrate/n+ type diode, and wherein the second diode is an n-well/p+ diode.

19. The method of claim 18, further comprising locating the first and/or second diodes on the substrate; and locating the internal and/or external IO pads on a top metal-inclusive layer of respective bonding pads.

20. A multi-chip module (MCM) package, comprising:

a plurality of external IO pads;

a plurality of external electrostatic discharge (ESD) protection circuits located under the external IO pads;

a plurality of dies or integrated circuits;

a plurality of internal bond pads provided to the dies or integrated circuits, the plurality of dies or integrated circuits being connected to each other via connections among and/or between the plurality of internal bond pads respectively provided thereto; and a plurality of internal electrostatic discharge (ESD) protection circuits located under the internal bonding pads, wherein the plurality of external ESD protection circuits provides a higher level of voltage protection than the plurality of internal ESD protection circuits, and wherein the external and/or internal ESD protection circuits comprise one or more diodes.

\* \* \* \* \*